United States Patent [19]

Nerod

[11] 4,297,583

[45] Oct. 27, 1981

[54] ULTRAVIOLET LIGHT APPARATUS

[75] Inventor: Irving Nerod, Spotswood, N.J.

[73] Assignee: American Can Company, Greenwich, Conn.

[21] Appl. No.: 125,373

[22] Filed: Feb. 28, 1980

Related U.S. Application Data

[63] Continuation-in-part of Ser. No. 11,525, Feb. 8, 1979, abandoned.

[51] Int. Cl.[3] .......................... H01J 37/00; F26B 3/30

[52] U.S. Cl. .................................... 250/453; 250/454; 250/504 R; 34/4

[58] Field of Search ................... 250/453, 454, 492 R, 250/503, 504; 34/1, 4, 105

[56] References Cited

U.S. PATENT DOCUMENTS

| | | | |
|---|---|---|---|
| 3,664,188 | 5/1972 | Kockott | 250/453 |
| 3,829,982 | 8/1974 | Pray et al. | 34/4 |
| 3,894,237 | 7/1975 | Choate et al. | 250/453 |
| 4,008,401 | 2/1977 | Holoubek et al. | 250/453 |
| 4,015,340 | 4/1977 | Treleven | 34/4 |
| 4,193,204 | 3/1980 | Nerod | 250/453 |

*Primary Examiner*—Bruce C. Anderson

*Attorney, Agent, or Firm*—Robert P. Auber; George P. Ziehmer; Paul R. Audet

[57] ABSTRACT

Apparatus for using radiant energy to cure inked or coated objects such as containers in which the objects are rotated and revolved at least part of the way around a linear energy source. A reflector is provided which focuses the energy on the surface of the rotating object and tracks it in its revolution around the energy source.

4 Claims, 3 Drawing Figures

ULTRAVIOLET LIGHT APPARATUS

BACKGROUND OF THE INVENTION

This application is a continuation-in-part of my co-pending application of the same title, Ser. No. 11,525 filed Feb. 8, 1979 now abandoned.

This invention relates to an apparatus for the use of radiant energy to cure coatings and inks on the surfaces of objects such as cans and other containers.

As will be understood upon reading the present disclosure, the prior art has utilized radiant energy curing apparatus, although in substantially different ways when compared to the present invention.

The following patents may be referred to for an appreciation of the prior art: U.S. Pat. Nos. 1,417,457; 2,719,282; 3,247,383; 3,764,799; 3,788,560; 3,811,828; 3,826,014; and 3,894,343.

Pray, U.S. Pat. No. 3,894,343 is typical of the art previously existing which related to ultraviolet curing of printing inks and includes a partially rotatable reflector with each of several tubular ultraviolet lamps. In the Pray patent, a freshly printed web is exposed to ultraviolet curing light from lamp assemblies on either side. The ultraviolet assembly includes a tubular ultraviolet bulb, the rays of which are concentrated by a reflector of suitable configuration and mounted in tubular shells rotatable 90° about their axes, from the position of that wherein the ultraviolet rays are focused on the web to another position wherein the web is shielded from the rays. This is done whenever the speed of the web falls below a certain value, thereby to prevent burning by the ultraviolet rays without the necessity of shutting off and re-starting the ultraviolet bulbs. The Pray structure is limited to the curing of flat sheet or web.

LaShells in U.S. Pat. No. 2,497,676 discloses equipment for infrared curing of coating materials. In the LaShells apparatus, coated objects are conveyed between parallel banks of infrared bulbs where the objects are subjected to direct and reflected radiation from a multitude of energy sources. There are substantial energy losses associated with this equipment, which tends to be bulky and non-uniform in its curing pattern.

Choate in U.S. Pat. No. 3,894,237 describes a method and apparatus for UV curing the exterior coating on cylindrical cans and container bodies. The Choate apparatus utilizes long, gas filled quartz tubes fixedly mounted on a frame and bodies with a reflector. The apparatus is disposed at a slight angle to the path of the conveyor so that as rotating container bodies pass beneath the apparatus, they are subjected to bands of concentrated ultra violet light. There are substantial energy losses associated with this type of equipment despite ray focusing since the spaces between the containers must be irradicated as well as the container bodies. Further, there is susceptibility to effecting a helical cure pattern on the container bodies thereby resulting in a non-uniform appearance. In the Choate apparatus, the lamps are linearly arrayed and typically require 4–50" tubes to effect cure when processing 600 cans per minute.

Holonbek in U.S. Pat. No. 4,008,401 discloses a UV curing system wherein tubular articles are mounted on stationary pins which are conveyed partly around a UV lamp. A stationary reflector captures stray light and redirects it onto the back of the article. The unit is substantial in size and does not lend itself to ready placement within an existing line.

Accordingly, it is an object of this invention to provide a compact, efficient apparatus for curing coatings and inks on can bodies and other cylindrical objects, and more particularly, an apparatus which lends itself to modular array in either a vertical, horizontal or cluster orientation.

It is further an object of this invention to provide an apparatus which ensures the uniform distribution of energy over the container surface to provide a high level of uniformity of appearance to the container.

Finally it is an object of this invention to provide a simple apparatus which is economical to construct, operate and service.

SUMMARY OF THE DISCLOSURE

It may be seen that the aforementioned objects of the invention may be attained in an apparatus which includes a stationary radiant energy source supported by a frame, a means for moving coated objects in a curved path at least partially around the energy sources, a means for rotating the coated objects in their passage, a reflector means supported on the frame and having a curved surface facing the energy source and operable to focus the rays therefrom onto one of the objects and a means for revolving the reflector around the energy source in synchronism with the movement of the objects. In this way, the energy source in continually focused on the coated object in its movement along the curved path. The radiant energy source may be an ultraviolet lamp.

More particularly, the apparatus may include a wheel rotatably mounted on the frame with a reflector affixed thereto, so that rotation of the wheel causes the reflector to revolve around the axis of rotation. The reflector being designed with a first focus coincident with the axis of rotation and a second focus lying outwardly therefrom. The radiant energy source, which may be ultraviolet light, is fixedly supported by the frame, at the first focus of the reflector, and is substantially coextensive with the reflector. The apparatus further includes a belt which is designed to engage and drive the wheel. The belt is provided with a plurality of carriers which serve to support and maintain the containers in confronting alignment with the reflector, so that the container intercepts rays from the reflector proximate the second focus of the reflector. In this way, the rays are maintained in focus on the container as the container revolves around the energy source. Further, a means is provided for rotating the carriers as they revolve around the energy source, thereby ensuring uniform irradiations of the container by the rays of focused energy.

It is preferable that the wheel be a sprocket wheel and the belt a drive chain. It is further preferable that the reflector be formed with an inner surface for reflecting the rays and an outer surface spaced therefrom. The opening between the inner and outer surfaces communicates with an intake at one end and an outlet at the other end, so that a coolant may be passed through the opening.

DETAILED DESCRIPTION OF THE PREFERRED EMBODIMENT

Figure 1:
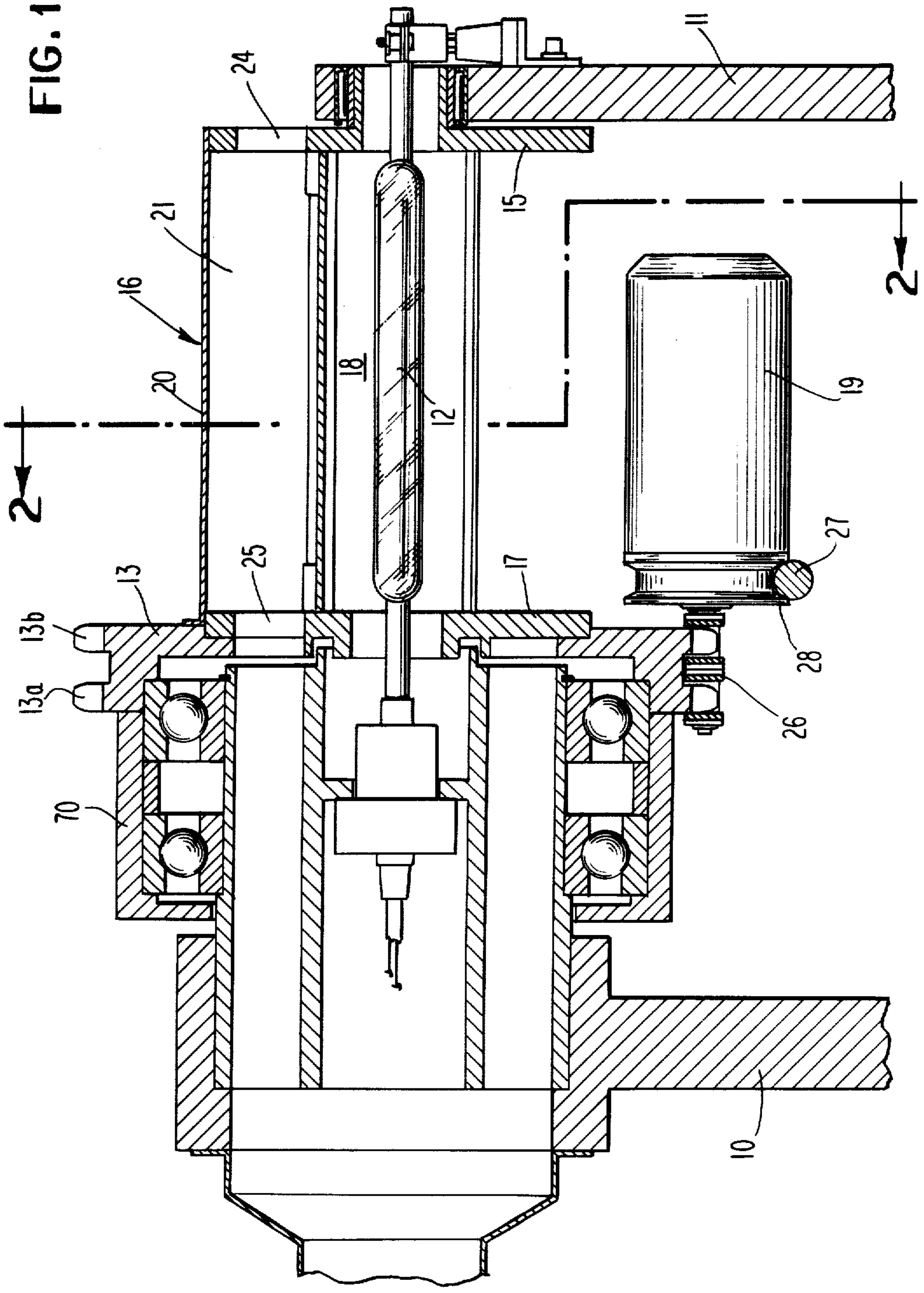
FIG. 1 is a sectional view in elevation of the preferred apparatus of the present invention.

The apparatus has frame members 10, 11 which provide support for a fixed linear ultraviolet lamp 12. The frame carries a sprocket wheel 13 having teeth such as teeth 13*a* and 13*b* shown in FIG. 1. The wheel 13 is affixed to a ring 17 and wheel 13 and ring 17 are connected to hub 70 mounted on ball bearings for rotation about the axis of the lamp 12.

Similarly, frame member 11 supports a ring 15 which is adapted for rotational movement about lamp 12.

A curved reflector 16 is attached to rings 15 and 17 for movement therewith. The reflector has an inner curved surface 18 for focusing the ultraviolet light from lamp 12 onto a container such as can 19*a* shown in FIG. 1. The reflector 16 also has an outer surface 20 affixed to the inner surface 18, but spaced therefrom to provide an opening 21 which communicates with a cool intake opening 24 at one end of the reflector and an outlet 25 at the other end thereof. If desired, suction means may be applied to the outlet 25 to create a high flow of cooling air through opening 21.

Each can is mounted on a conventional carrier which in turn is carried by chain 26 for revolution about lamp 12 in a curved path of about 180° to about 270°. As the can revolves around lamp 12, the can is rotated on its own axis by rail 27 which bears against mounting base 28.

Figure 2:
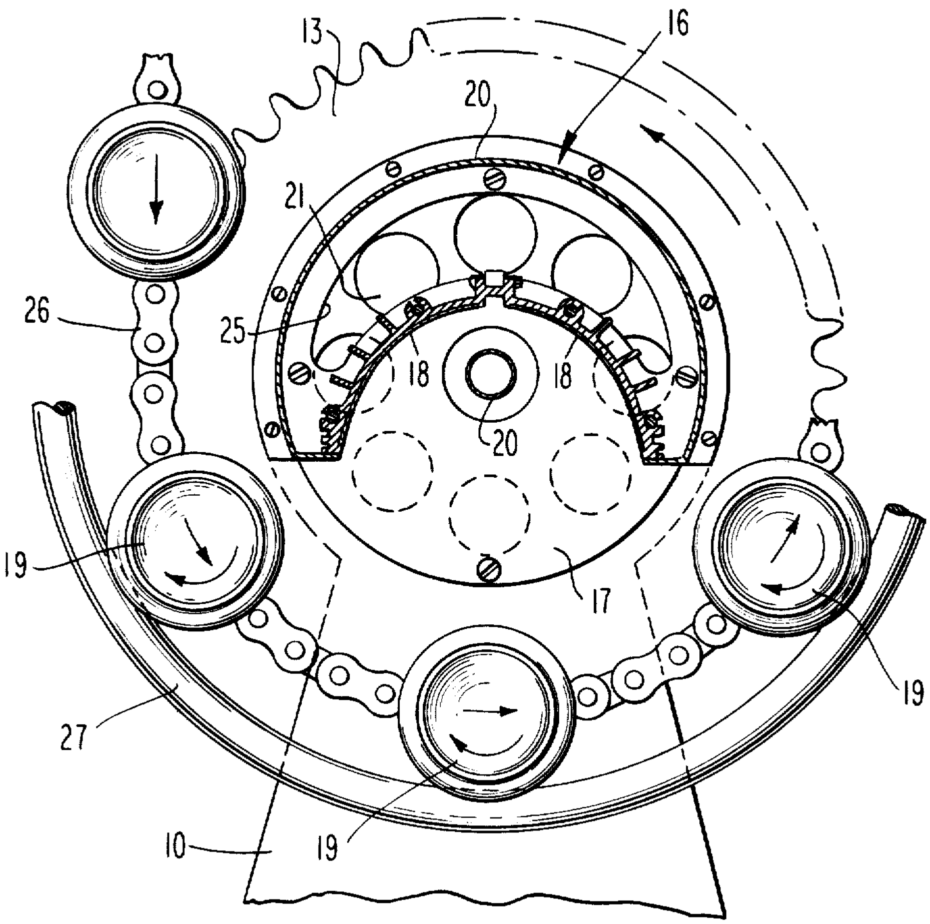
FIG. 2 is a sectional view taken along the lines 2—2 of FIG. 1.

Turning now to FIG. 2 herein shown is a sectional view of FIG. 1 taken along line 2—2. A representitive segment of conveyor chain 26 is shown proximate the irradiation apparatus with a plurality of can bodies 19*a*, 19*b*, 19*c*, 19*d*.

Figure 3:
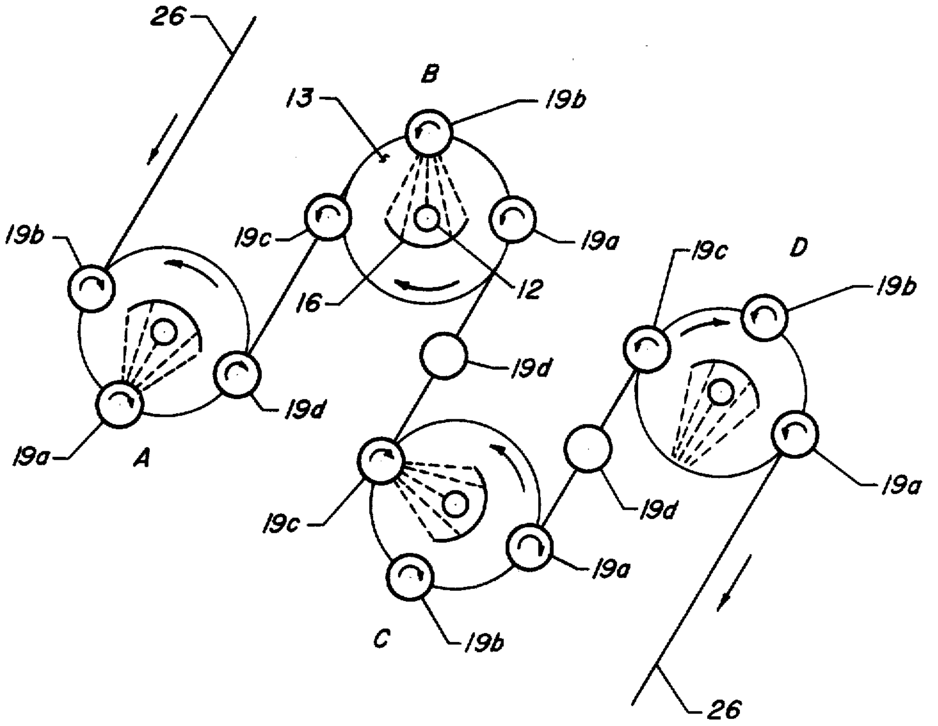
FIG. 3 is a schematic representation of a 4 module irradiator apparatus arranged in series so that each module irradiates every fourth container.

The chain segments engage the teeth of sprocket wheel 13 causing the wheel to rotate and with it reflector 16 which is affixed to the sprocket wheel by means bolts 22. As shown in FIG. 2, the conveyor chain 26 moves counterclockwise around lamp 12, thereby causing sprocket wheel 13 to also move in a counterclockwise direction, and further causing cans 19*a*, 19*b*, 19*c*, 19*d* to rotate clockwise as they revolve counterclockwise. Only one of the cans shown, 19*a*, will be irradiated by the energy emitted by lamp 12 and focused by reflector 16. Due to the interlocking of the chain and the sprocket wheel the focused rays intercept a single container and track that container in its orbital path about the lamp. At some point along its path, say 180° from entry, the chain leaves the sprocket wheel and the container passes on from the curing influence of the lamp. The next container 19*b*, will only be irradiated by the lamp 12 if the distance between irradiated container 19*a* and container 19*b* is equal to the pitch circumference of sprocket wheel 13 or a multiple thereof. Closer spacing as shown in FIG. 2 requires multiple irradiation modules with a separate module for each container falling within the pitch circumference interval. Thus container 19*a* will be irradiated in the A module, container 19*b* in the B module, container 19*c* in the C module, container 19*d* in the D module. FIG. 3 is a schematic diagram showing a 4 module unit with each module A, B, C and D irradiating one fourth of the container bodies.

In a multimodule system, the drive chain 26 is woven under one sprocket wheel and over the next one. In this way, the wheels of A and C are caused to rotate counterclockwise whereas wheels of B and D are caused to rotate in a clockwise manner. Similarly, the containers will rotate clockwise as they revolve around the lamps of modules A & C, whereas they will rotate counterclockwise in revolving around the lamps of modules B & D. If, however, the drive chain 26 progressed from right to left, rather than from left to right, as shown in FIGS. 2 and 3, then the rotational movements would necessarily be reversed.

In a typical line, capable of handling up to 600 cans per minute, eight modules might be required. These units would occupy a total of five lineal feet and have a total power requirement of approximately 20000 watts. In contrast, a typical linear lamp system would entail the use of four 50″ lamps which would occupy approximately 16 lineal feet of floor space and have a total power consumption of 40000 watts.

While the instant structure has been disclosed for use with an ultraviolet lamp, it should be appreciated that the concept may be applicable to other forms of radiant energy such as infrared lamps.

Further it should be appreciated that other conveyor and drive means might be employed in place of the sprocket wheel and chain. Other modifications of the instant concept will be apparent to one skilled in the art.

Thus it can be seen that the instant invention provides a means for effecting the uniform distribution of energy over the surface of a cylindrical object such as a coated can, that it is highly efficient, compact, and lends itself to modular array. Finally, it may be appreciated that the instant structure is simple to construct, economical to operate and may be readily serviced.

What is claimed is:

1. Apparatus for curing ink or coatings on a cylindrical container comprising:

(a) a frame;

(b) a wheel, mounted on said frame for rotation about an axis;

(c) a reflector, affixed to said wheel for movement therewith about said axis, said axis being co-incident with a first focus of said reflector and wherein a second focus is outward thereof;

(d) a radiant energy source fixedly mounted on said frame, substantially co-extensive with said reflector and disposed at said first reflector focus;

(e) a belt disposed to engage said wheel at the circumference and drive said wheel, said belt including a plurality of carriers mounted thereon for (one of said carriers) supporting and (maintaining said container in confronting alignment with said reflector) conveying said containers, said carriers being disposed along said belt at intervals equal to the circumference of said wheel, said belt engaging said wheel to advance said carriers into individual registration with said reflector wherein said container mounted on said registered carrier is substantially co-extensive with said energy source and is confrontingly aligned with said reflector whereby said confrontingly aligned container intercepts rays from said reflector, proximate the second focus of said reflector, and wherein said rays are maintained substantially in focus on said confrontingly aligned containers as said confrontingly aligned container moves around said energy source; and (f) means for rotating said carriers as said carriers move around said energy source thereby ensuring uniform irradiation of said confrontingly aligned container by said focused rays of energy.

2. Apparatus as recited in claim 1 wherein said wheel is a sprocket wheel and said belt is a chain.

3. Apparatus as recited in claim 1 wherein said energy source is an ultraviolet lamp.

4. Apparatus as recited in claim 1 wherein said reflector has an inner surface for reflecting said rays and an outer surface affixed to said inner surface but spaced therefrom to provide opening which communicates with an intake at one end and an outlet at the other end for passage of coolant through said opening.

* * * * *